United States Patent
Deguchi et al.

(10) Patent No.: US 8,143,901 B2
(45) Date of Patent: Mar. 27, 2012

(54) TEST APPARATUS, TEST METHOD, AND INTEGRATED CIRCUIT

(75) Inventors: Chikahiro Deguchi, Kawasaki (JP); Yutaka Sekino, Kawasaki (JP); Shogo Shibazaki, Kawasaki (JP); Shinkichi Gama, Kawasaki (JP); Takeshi Nagase, Kawasaki (JP); Hideyuki Negi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 455 days.

(21) Appl. No.: 12/379,371

(22) Filed: Feb. 19, 2009

(65) Prior Publication Data

US 2009/0300443 A1 Dec. 3, 2009

(30) Foreign Application Priority Data

May 30, 2008 (JP) .................................. 2008-143771

(51) Int. Cl.
*G01R 31/02* (2006.01)

(52) U.S. Cl. .................................. 324/537; 324/765.01
(58) Field of Classification Search .................. 324/537, 324/765.01; 714/718, 719, 733, 735; 365/201
See application file for complete search history.

(56) References Cited

U.S. PATENT DOCUMENTS

| 5,940,874 A * | 8/1999 | Fulcomer ...................... 711/217 |
| 2001/0049807 A1* | 12/2001 | Kim ............................. 714/743 |

FOREIGN PATENT DOCUMENTS

| JP | 1-238317 | 9/1989 |
| JP | 8-18440 | 1/1996 |

* cited by examiner

*Primary Examiner* — Vincent Q Nguyen
(74) *Attorney, Agent, or Firm* — Staas & Halsey LLP (57) ABSTRACT

A test apparatus includes an up counter, a down counter, a selector that selects either an up counter output from the up counter or a down counter output from the down counter, an inversion circuit that inverts either the counter output selected by the selector or the counter output nonselected by the selector, and a comparison circuit that compares the counter output inverted by the inversion circuit and the other counter output.

8 Claims, 8 Drawing Sheets

TEST APPARATUS, TEST METHOD, AND INTEGRATED CIRCUIT

CROSS-REFERENCE TO RELATED APPLICATION

This application is based upon and claims the benefit of priority of the prior Japanese Patent Application No. 2008-143771, filed on May 30, 2008, the entire contents of which are incorporated herein by reference.

FIELD

An embodiment of the present invention discussed herein relates to a test system for testing an integrated circuit, a test method of an integrated circuit, and an integrated circuit provided with a test circuit.

BACKGROUND

In general, a built-in self test (BIST) module for testing a memory is formed as part of a large-scale integrated circuit (LSI) together with a user circuit for operating the memory. The BIST module is provided with a counter able to count up/down for successively designating addresses of a memory. When connecting a BIST module to a memory and running a memory test, data is written to and read from all addresses of the memory. At this time, all addresses of the memory are designated while the up/down counter increments its count from the minimum value to the maximum value of the addresses. Next, all addresses of the memory are designated while the up/down counter decrements its count from the maximum value to the minimum value of the address.

In this regard, when testing the operation of the LSI itself including the BIST module, the test is performed without connecting a memory. The LSI is tested by operating the counter, monitoring the LSI terminals, and comparing the value output from the counter and the anticipated value. In the past, to serially operating the test sequence, after the up operation of the up/down counter, a down operation of the up/down counter was performed. However, since the up operation of the counter is followed by a down operation, enormous time was taken for testing the counter.

Note that to raise the operating frequency of the counter, it is known to provide an odd counter and an even counter to perform parallel operations. Further, a parallel type error counter circuit counting the error data bits transmitted in parallel by a simple circuit configuration is known (see Japanese Laid Open Patent Publication No. 8-184440 and Japanese Laid Open Patent Publication No. 1-238317)

SUMMARY

According to an aspect of the embodiment, a test apparatus includes an up counter, a down counter, a selector capable of selecting either an output of the up counter or an output of the down counter, an inversion circuit that inverts either the counter output selected by the selector or the counter output that is not selected by the selector, and a comparison circuit that compares the counter output inverted by the inversion circuit and the other counter output.

According to an aspect of the embodiment, a test method of a circuit includes selecting either an up counter output or a down counter output, inverting either the selected counter output or the not-selected counter output, and comparing the inverted counter output and the other counter output.

According to an aspect of the embodiment, an integrated circuit includes an up counter, a down counter, an inverter that inverts one of the up counter output or the down counter output, and a comparator that compares the inverted counter output with the other counter output.

The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF DRAWINGS

The object and features of the present invention will become clearer from the following description of the preferred embodiments given with reference to the attached drawings, wherein.

DESCRIPTION OF EMBODIMENT

Below, an embodiment of the invention will be explained with reference to the drawings.

Figure 1:
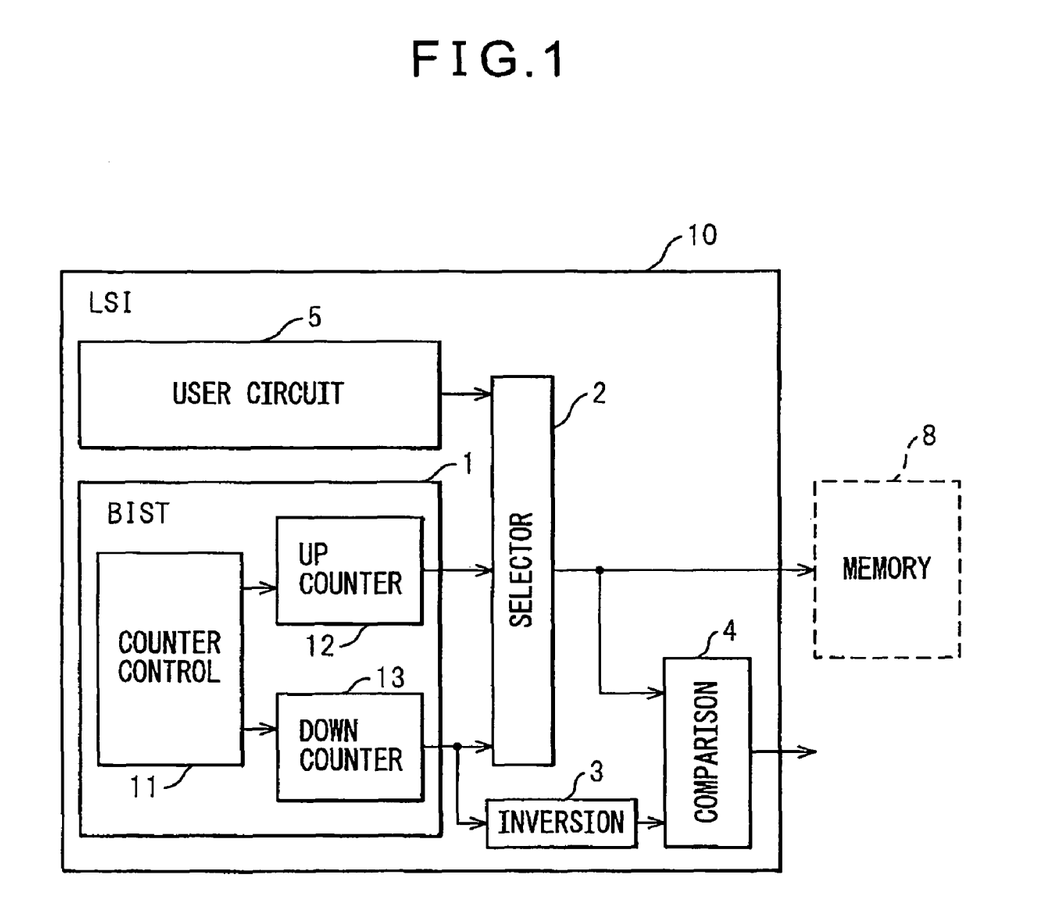
FIG. 1 is a view depicting the test system of an embodiment of the invention.

FIG. 1 is a view depicting an embodiment of the invention in brief. An LSI 10 includes a user circuit 5 for accessing a memory 8 by a user application and a BIST module 1 for running a memory test. A selector 2 selects an address signal outputted from the user circuit 5 and an address signal outputted from the BIST module 1 and accesses the memory 8.

In the present embodiment, the BIST module 12 includes an up counter 12 and a down counter 13. In a normal memory test, predetermined data is written in and read out from all addresses of the memory while the up counter 12 is operated and incremented in count from the minimum value to the maximum value of the addresses. Next, predetermined data is written in and read out from all addresses of the memory while the down counter 13 is operated and decremented in count from the maximum value to the minimum value of the addresses. Note that, when running the memory test, it is also possible to operate the down counter first, then operate the up counter. Whatever the case, the two counters are successively operated.

In this regard, when testing an LSI 10, the LSI 10 is not connected to the memory 8 and the signal outputted from the output terminal of the LSI 10 is checked. In the present embodiment, at the time of testing the LSI 10, the up counter 12 and the down counter 13 are/simultaneously operated. The output of the up counter 12 and the output of the down counter 13 are inputted to the selector 2 to select one of the output of the counters. When testing the LSI 10, the output of the up counter 12 is selected. The selected output of the up counter 12 is outputted from the selector 2 and is inputted to one of input terminals of a comparison circuit 4. The output of the down counter 13 is inputted to an inversion circuit 3. The output of the down counter 13 is inverted in the inversion circuit 3. Then the inverted output of the down counter 13 is inputted to the other input terminal of a comparison circuit 4. In the comparison circuit 4, the output of the up counter 12 is compared with the inverted output of the down counter 13. If the circuit of the LSI 10 is normal, the output of the up counter 12 and the inverted output of the down counter 13 match. Therefore, the results of the comparison may be monitored to judge normality/abnormality of the LSI 10.

Figure 2:
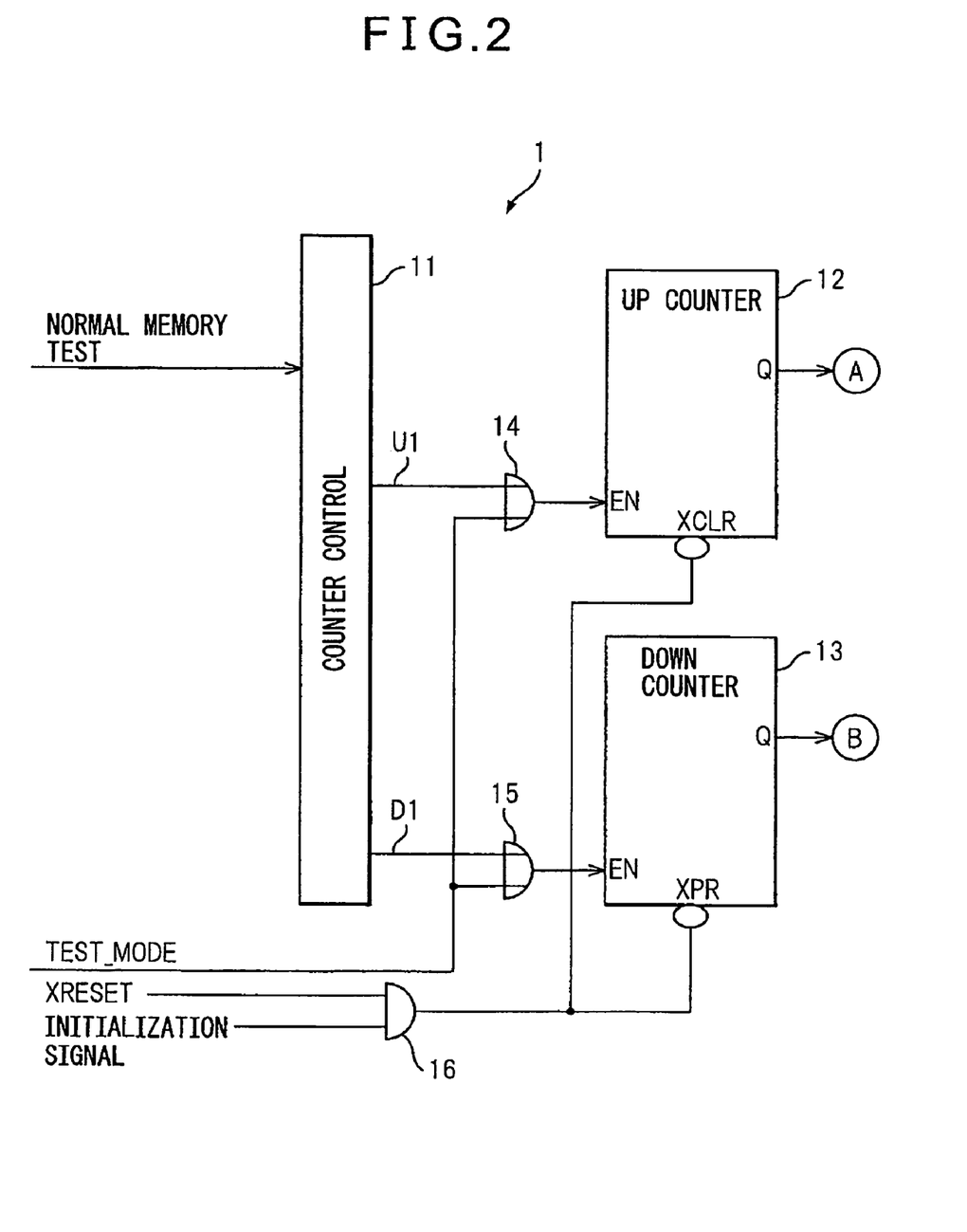
FIG. 2 is a view depicting a BIST circuit including an up counter and down counter in the test system of the present embodiment.
Figure 3:
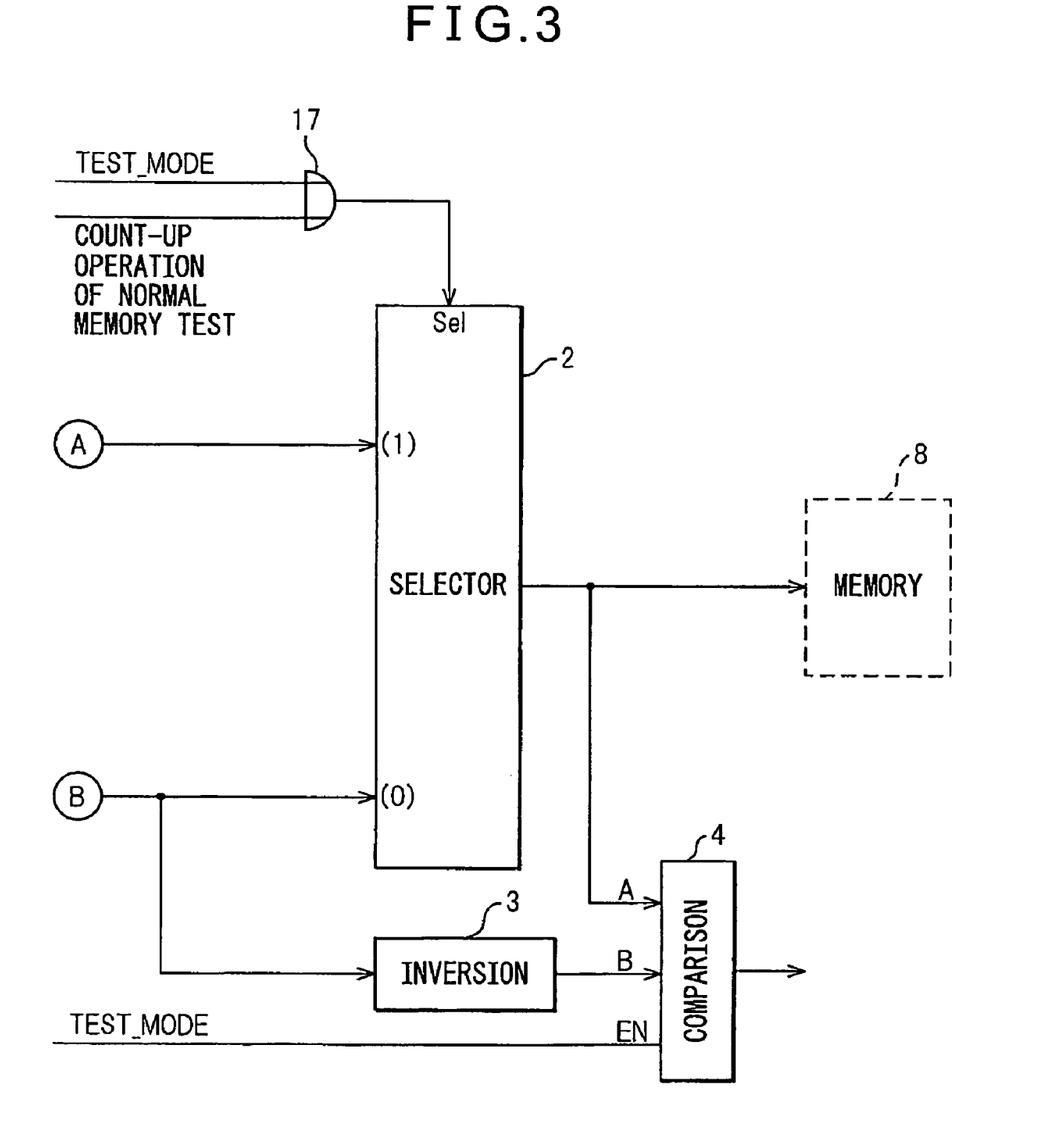
FIG. 3 is a view depicting a circuit processing an up counter output and down counter output in the test system of the present embodiment.

Next, referring to FIGS. 2 and 3, the present embodiment will be explained in detail. FIG. 2 is a view for explaining a BIST circuit of the present embodiment. FIG. 3 is a view for explaining a selector block, inversion circuit, and comparison circuit of the present embodiment. The circuit illustrated in FIG. 3 is connected to the circuit illustrated in FIG. 2.

A normal memory test is run by connecting the memory 8 (see FIG. 3) to the LSI 10. In the normal memory test, a normal memory test signal is inputted to a counter control circuit 11. In this example, assume that the normal memory test signal becomes "1" at the time of a memory test. When the normal memory test signal is inputted to the counter control circuit 11, the counter control circuit 11 outputs a count-up enable signal U1. The count-up enable signal U1 is inputted to an enable terminal EN of the up counter 12 through a first OR circuit 14 so as to make the up counter 12 operate. In accordance with the input of the count-up enable signal U1, the up counter 12 starts the count from the minimum value and continues the count until the counted value is reaching the maximum value.

Referring to FIG. 3, the output of the up counter 12 is inputted to a terminal (1) of the selector 2. Further, the terminal Sel of the selector block 2 receives, as inputted through a third OR circuit 17, a signal selecting either of the signal inputted to the terminal (1) of the selector 2 or the signal inputted to the terminal (0) of the selector 2. The third OR circuit 17 receives a TEST_MODE signal indicating that the test mode is the LSI test mode, and a normal memory test signal. The normal memory test signal is inputted to the third OR circuit 17 at the time of a count-up operation by the up counter 12. Assume that the TEST_MODE signal becomes "1" at the time of the LSI test mode.

When the normal memory test is run and the up counter 12 is counting up, the normal memory test signal becomes "1" and the signal "1" is inputted to the terminal Sel of the selector 2 so as to select the terminal (1) of the selector 2. In this case, the selector 2 outputs the output of the up counter 12. Further, due to the count value outputted from the selector 2, the address of the memory 8 connected to the LSI 10 is incremented from the minimum value until reaching the maximum value for sequentially designating the memory address.

Each time an address of the memory 8 is designated, predetermined data is written at the designated address of the memory 8. The written data is read out from the memory 8, and the read out data is compared with the anticipated value.

If the up counter 12 of the FIG. 2 counts to the maximum value of the addresses, the counter control circuit 11 outputs a count-down enable signal D1. The count-down enable signal D1 is inputted to the enable terminal EN of the down counter 13 through the second OR circuit 15 to make the down counter 13 operate. The down counter 13 starts the count from the maximum value in accordance with the input of the count-down enable signal D1 and counts until the counted value reaches the minimum value.

The output of the down counter 13 is input to the terminal (0) of the selector 2 of FIG. 3. When the count-up by the up counter 12 ends, the normal memory test signal becomes "0" and the terminal Sel of the selector 2 receives "0". Therefore, the terminal (0) of the selector 2 is selected, then the selector 2 outputs the output of the down counter 13. Further, based on the count value of the down counter 13 outputted from the selector 2, the address of the connected memory 8 is decremented from the maximum value for sequentially designating the memory address until reaching the minimum value.

Each time an address of the memory 8 is designated, predetermined data is written at the designated address of the memory 8. The written data is read out from the memory 8, and the read out data is compared with the anticipated value for a memory test. When the designated address of the memory 8 reaches the minimum value, the memory test ends.

Next, referring to FIG. 2, the LSI test mode where the LSI is tested without connecting a memory 8 to the LSI will be explained. First, an XRESET signal and initialization signal are inputted to a terminal XCLR of the up counter 12 and a terminal XPR of the down counter 13 through a first AND circuit 16 so as to initialize the up counter 12 and the down counter 13. Next, a TEST_MODE signal indicating the LSI test mode is inputted to the enable terminals EN of the up counter 12 through the first OR circuit 14 and the down counter 13 through the second OR circuit 15. By the input of the TEST_MODE signal, the up counter 12 and the down counter 13 can be operated in parallel.

The TEST_MODE signal is further inputted to the counter 2 illustrated in FIG. 3 through the third OR circuit 17. Based on the input of the TEST_MODE signal, the output of the up counter 12 that is inputted to the terminal (1) of the selector 2 is selected. The selected output of the up counter 12 is outputted from the selector 2.

On the other hand, the output of the down counter 13 operating in parallel with the up counter 12 is inputted to the terminal (0) of the selector 2. Further, the output of the down counter 13 is inputted to the inversion circuit 3. An inverted signal B obtained by inverting the inputted signal, that is, the count value of the down counter 13, is outputted from the inversion circuit 3. The down counter 13 operates simultaneously with the up counter 12 and outputs a signal decremented from the maximum value to the minimum value. For example, when the up counter 12 and down counter 13 are made of 4-bit counters, the up counter counts 0, 1, 2, 3, . . . 15 and the down counter operates as 15, 14, 13, . . . 1. Therefore, the inverted signal of the output of the down counter 13 matches the output of the up counter 12 if there is no abnormality.

The inverted signal B is inputted to the comparison circuit 4 together with the output signal A from the selector 2. The comparison circuit 4 operates at the time of the LSI test mode where the TEST_MODE signal is inputted to the enable terminal EN. The comparison circuit 4 compares the input signals. In other words, the comparison circuit 4 compares the signal A of the up counter 12 outputted from the selector 2 and the inverted signal B of the output of the down counter 13.

A signal indicating the normal state, for example "0", is outputted from the comparison circuit 4 when the signal A and the inverted signal B match. On the other hand, a signal "1" indicating an error is output from the comparison circuit 4 when the signal A ant the inverted signal B do not match. The output of the comparison circuit 4 is continuously monitored or stored in a storage device, then it is judged if there is any error in the LSI 10, in particular the up counter and down counter.

Figure 4:
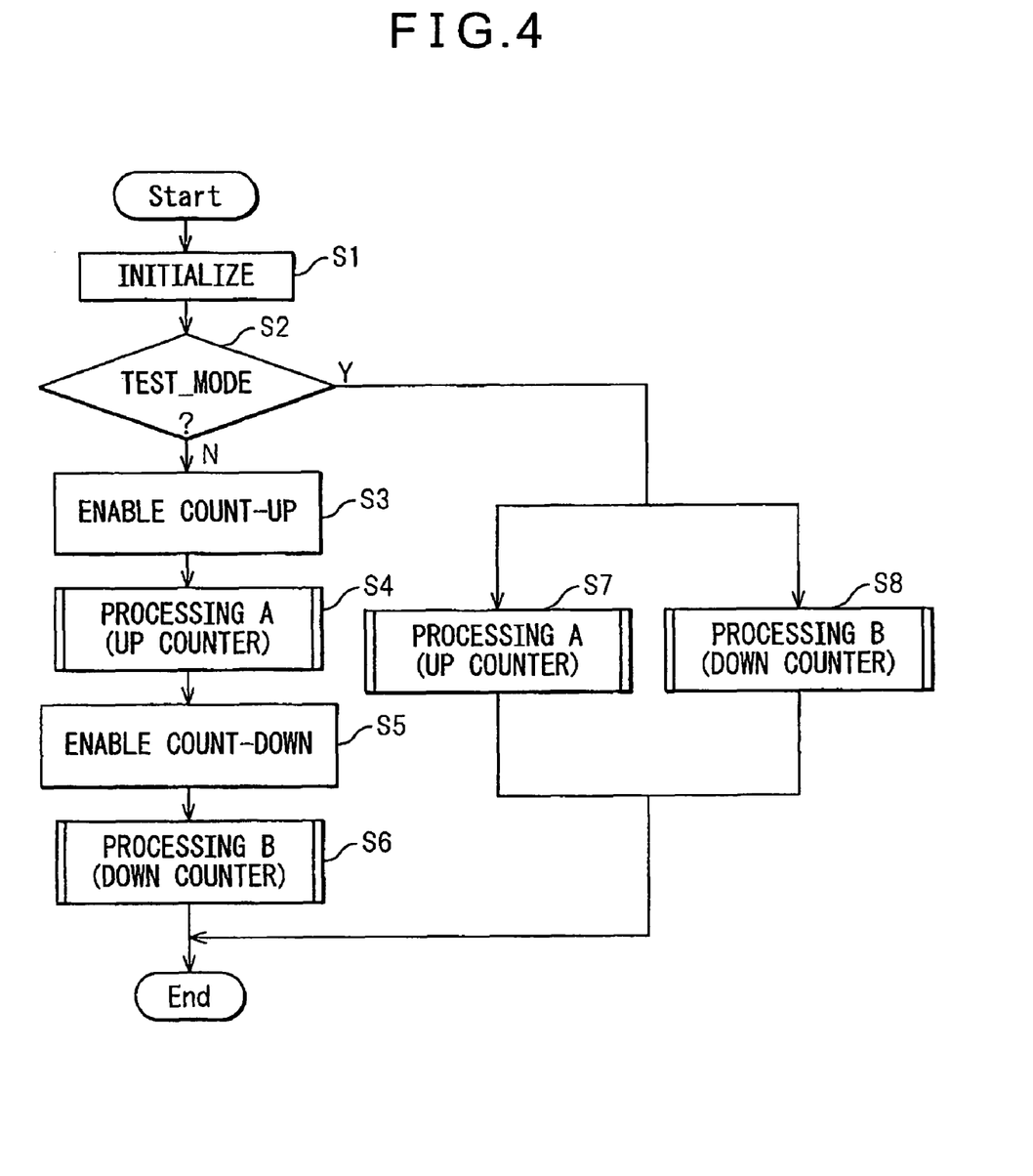
FIG. 4 is a flow chart of the operation of the up counter and down counter of the test system of the present embodiment.

FIG. 4 is a view depicting a flow chart illustrating an operation of the counter of the present embodiment. First, the initialization signal is set to the counters, whereby the up counter 12 and down counter 13 are initialized (S1).

Next, it is judged if a TEST_MODE signal has been inputted so as to judge if the test mode is the LSI test mode (S2). If the test mode is not the LSI test mode, the count-up enable signal is set for the up counter 12 (S3), and a count-up operation is started from the minimum value of the address of memory 8. Next, the process A performed by the up counter 12 (referred to as "up counter processing A") is executed (S4).

Figure 5:
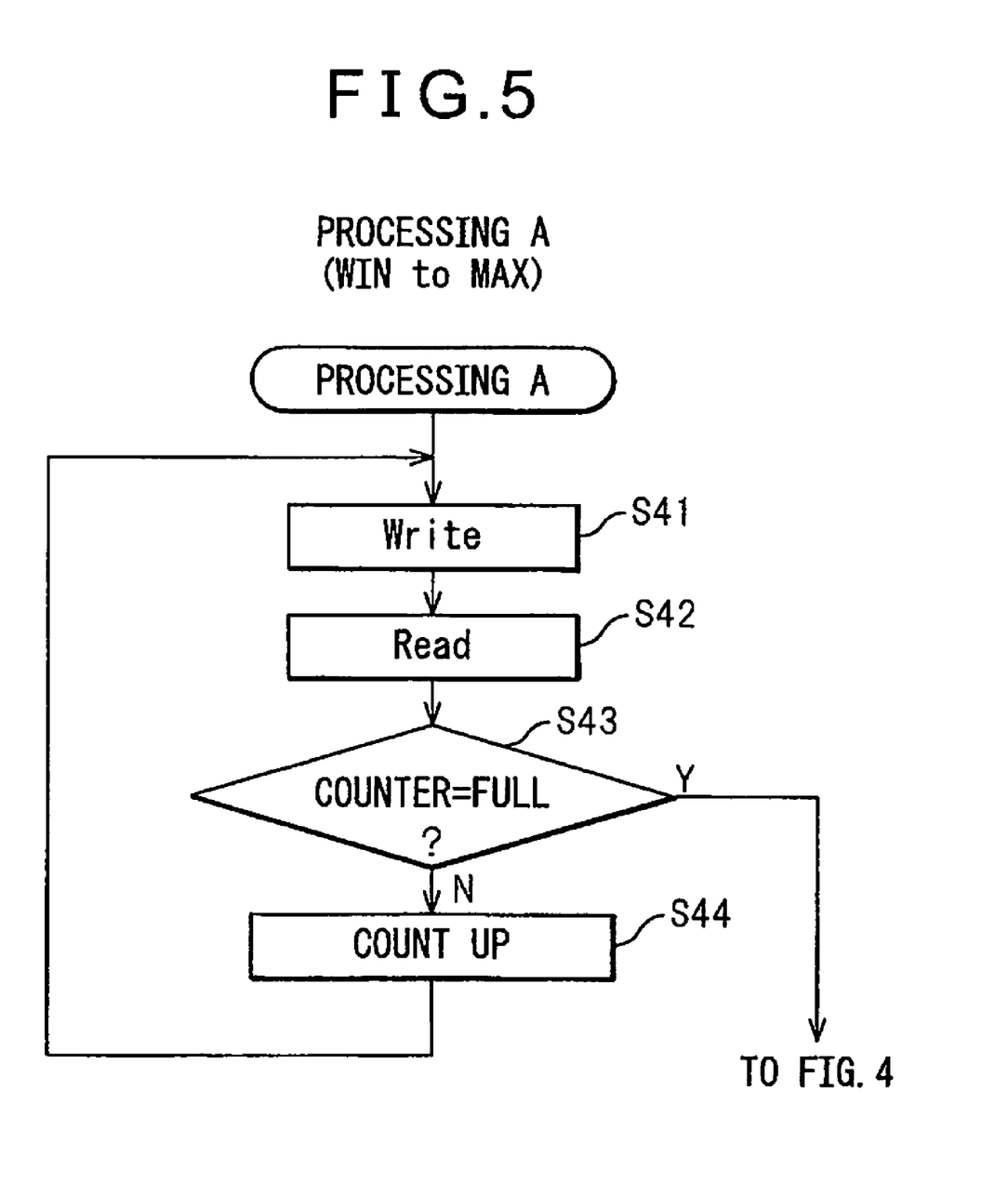
FIG. 5 is a view depicting the operation of the up counter of the test system of the present embodiment.

FIG. 5 depicts the up counter processing A. At the up counter processing A, predetermined data is written into the memory cell designated by the addresses of the memory 8, that is a value counted by the up counter 12 (S41), then the data written in the memory cell is read out from the memory cell (S42). At the time of starting the up counter processing A, the address of the memory 8 is the minimum value. At this time, the data read out from the memory cell is compared with the data written in the same memory cell. The results of comparison are monitored to check if there is an abnormality in the memory cell.

Next, it is judged if the counted value of the up counter 12 has become full, in other words, if the up counter 12 counted up the maximum value (S43). If the up counter 12 is not full, the counter 12 counts up, that is, increments the count (S44), returns to step S41, and repeats steps S41 to S43. On the other hand, if the up counter 12 becomes full at step S43, the routine returns to S5 of FIG. 4.

At step S5 of FIG. 4, the count operation of the up counter 12 is ended, so the count-down enable signal is set at the down counter 13, and the count-down operation by the down counter 13 is started from the maximum value of the addresses of the memory 8. Next, the down counter processing B is executed (S6).

Figure 6:
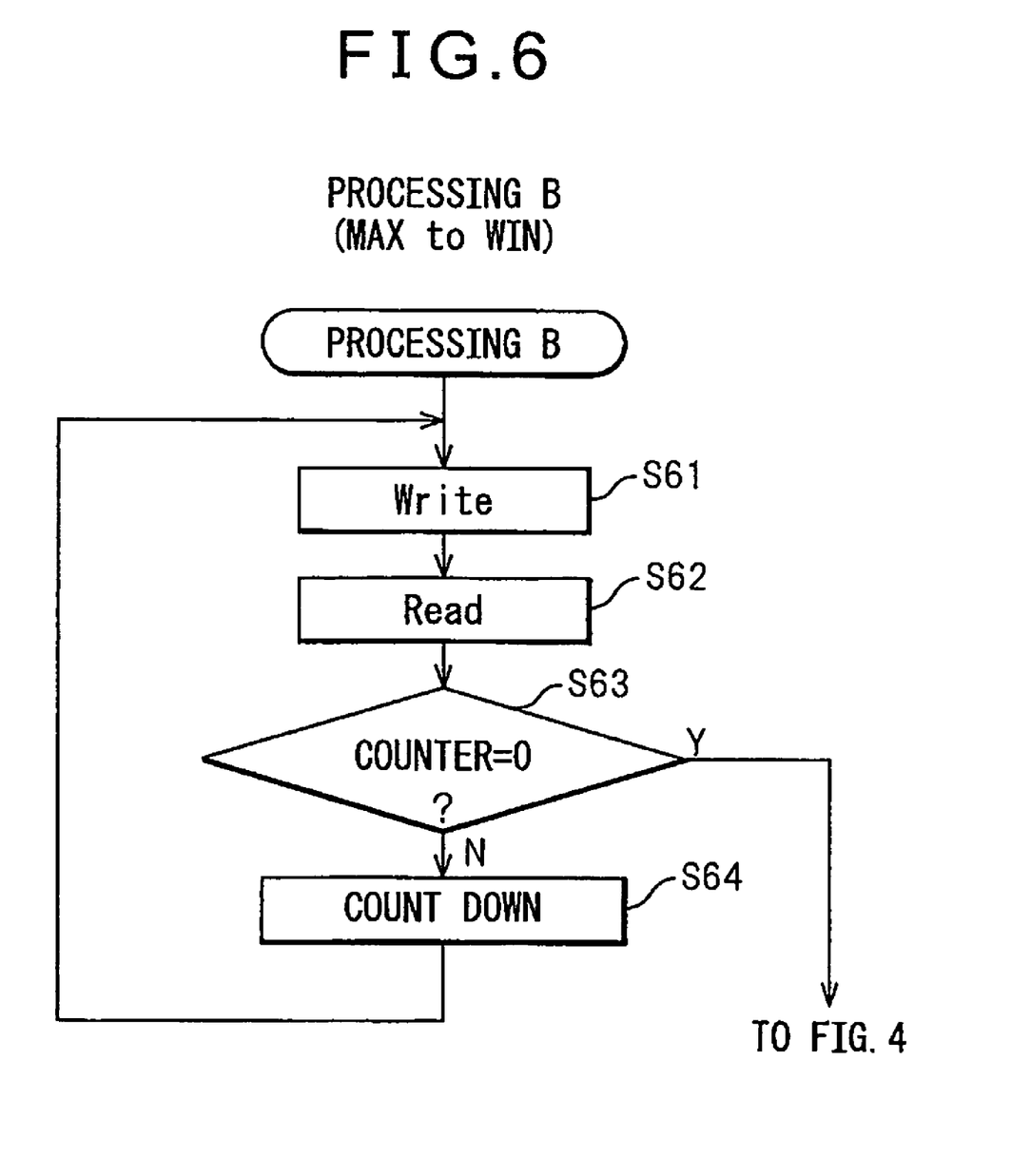
FIG. 6 is a view depicting the operation of the down counter of the test system of the present embodiment.

FIG. 6 shows the down counter processing B. Predetermined data is written into the memory cell designated by the address of the memory 8, which is an output of the down counter 13 (S61), then the data written in the memory cell is read out (S62). At the time of starting the down counter processing B, the address of the memory 8 is the maximum value. At this time, the data read out from the memory cell is compared with the data written in the same memory cell. The results of comparison are monitored to check if there is any abnormality in the memory cell.

Next, it is judged if the counted value of the down counter 13 has become 0, in other words, if the down counter 13 counted up the minimum value (S63). If the count value of the down counter 13 is not 0, the counter 13 is counted down, that is, is decremented, then the routine returns to (S63)S61, and operations correspond to S61 to S63 are repeated. If it is determined at S63 that the down counter 13 becomes 0, the normal memory test of the flow of FIG. 4 is ended.

If it is judged at S2 of FIG. 4 that the TEST_MODE signal is inputted to the counters, that means the mode is the LSI test mode, S7 and S8 are executed in parallel. At S7, up counter processing A is performed. At S8, down counter processing B is performed.

At the LSI test mode, the LSI 10 is not connected to the memory 8. Therefore, in the up counter processing A and down counter processing B, data is not written in or read out from the address of the memory designated by the counter outputs.

As explained with reference to FIGS. 2 and 3, during the operations of steps S7 and S8 operating in parallel, the count value counted up by the up counter 12 and the inverted value of the count value counted down by the down counter 13 are successively compared. The results of comparison are monitored. If a mismatch between the count value and the inverted value occurs, an error signal is issued.

When steps S7 and S8 end, the LSI test mode is ended.

In the present embodiment, the up counter 12 and the down counter 13 are provided, and may be successively operated to run a memory test. Further, it is possible to operate the up counter 12 and the down counter 13 in parallel to run the LSI test. Further, at the time of the LSI test, the processing time of the counter operation can be substantially halved. Further, operation of the counter control block is not required, so the LSI test according to the present embodiment may require a time of less than ½ of the time the conventional LSI test requires.

Figure 7:
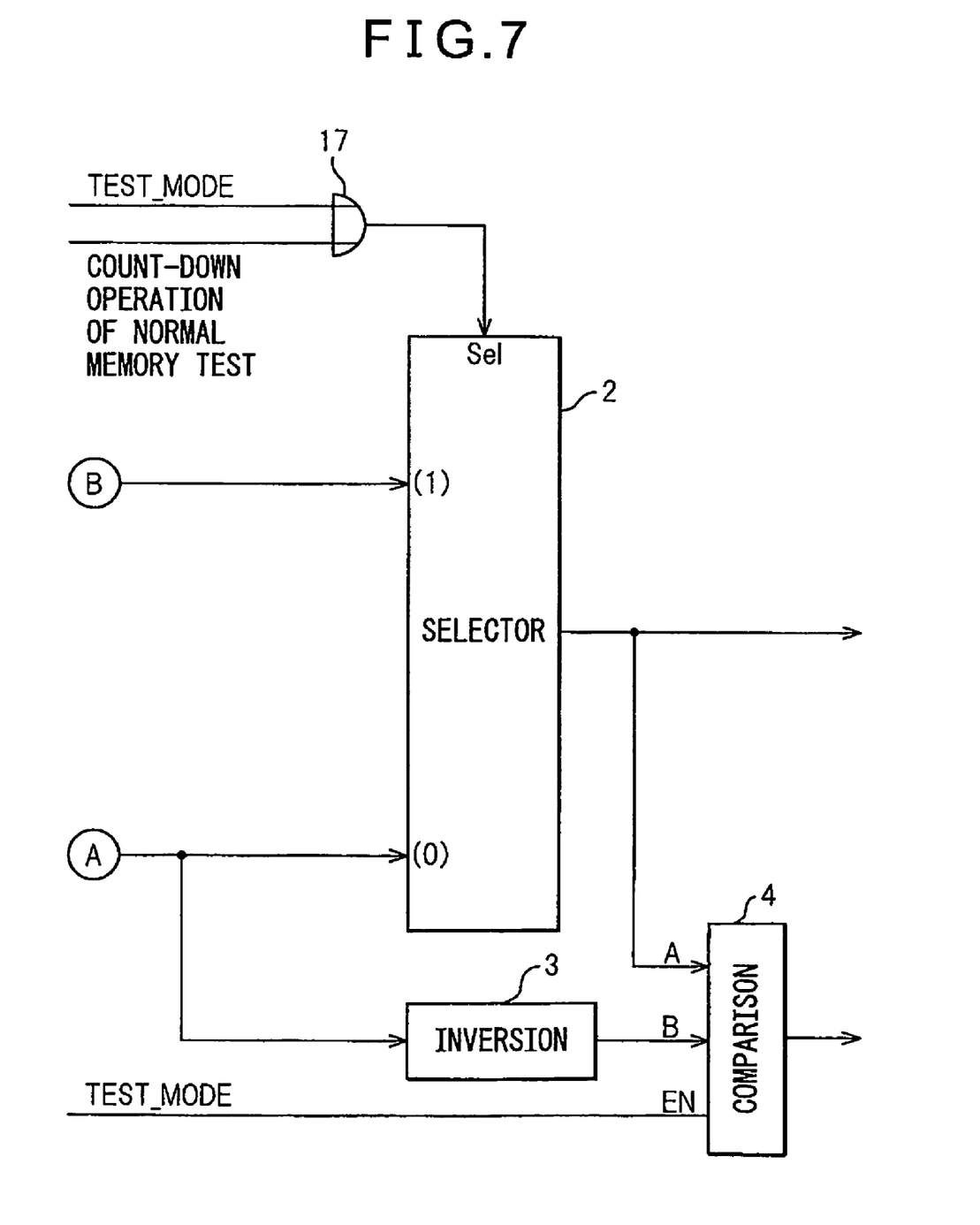
FIG. 7 is a view depicting a modification of the circuit shown in FIG. 3.

FIG. 7 depicts a modification of the circuit depicted in FIG. 3. In FIG. 7, the terminal (1) of the selector 2 receives the output of the down counter 13. Further, the terminal (0) of the selector 2 receives the output of the up counter 12. Further, the Sel terminal of the selector 2 receives the normal memory test signal at the time of a count-down operation of the down counter 13, and receives the TEST_MODE signal at the time of the LSI test mode, through the third OR circuit 17.

At the time of the memory test, the signal "1" inputs to the Sel terminal of the selector 2 when the down counter 13 operates a count-down operation. Therefore, the output of the down counter 13 inputted to the terminal (1) of the selector 2 is selected. Further, the signal "0" inputs to the Sel terminal of the selector 2 at the time of a count-up operation of the up counter 12, so the output of the up counter 12 inputted to the terminal (0) of the selector 2 is selected.

At the time of the LSI test mode, the selector 2 receives the output of the up counter 12 and the output of the down counter 13 operating simultaneously in parallel. However, if the LSI test mode signal TEST_MODE "1" is inputted to the terminal Sel of the selector 2, the output of the down counter 13 inputted to the terminal (1) of the selector 2 is selected, and is outputted from the selector 2. The output of the selector 2 is inputted to the terminal A of the comparison circuit.

On the other hand, the output of the up counter 12 inputted to the selector 2 is inputted to the inversion circuit 3, inverted by the inversion circuit 3, and is inputted to the terminal B of the comparison circuit. The comparison circuit 4 operates by the LSI test mode signal TEST_MODE being inputted to the terminal EN of the comparison circuit 4.

Therefore, the output signal A of the down counter 13 and the inverted signal B of the output of the up counter 12 are compared at the comparison circuit 4. If they do not match, an error signal of "H" is outputted from the comparison circuit 4.

Therefore, in the example of FIG. 7, it is possible to test the operations of the up counter 12 and down counter 13 by constantly monitoring the output of the comparison circuit 4.

Figure 8:
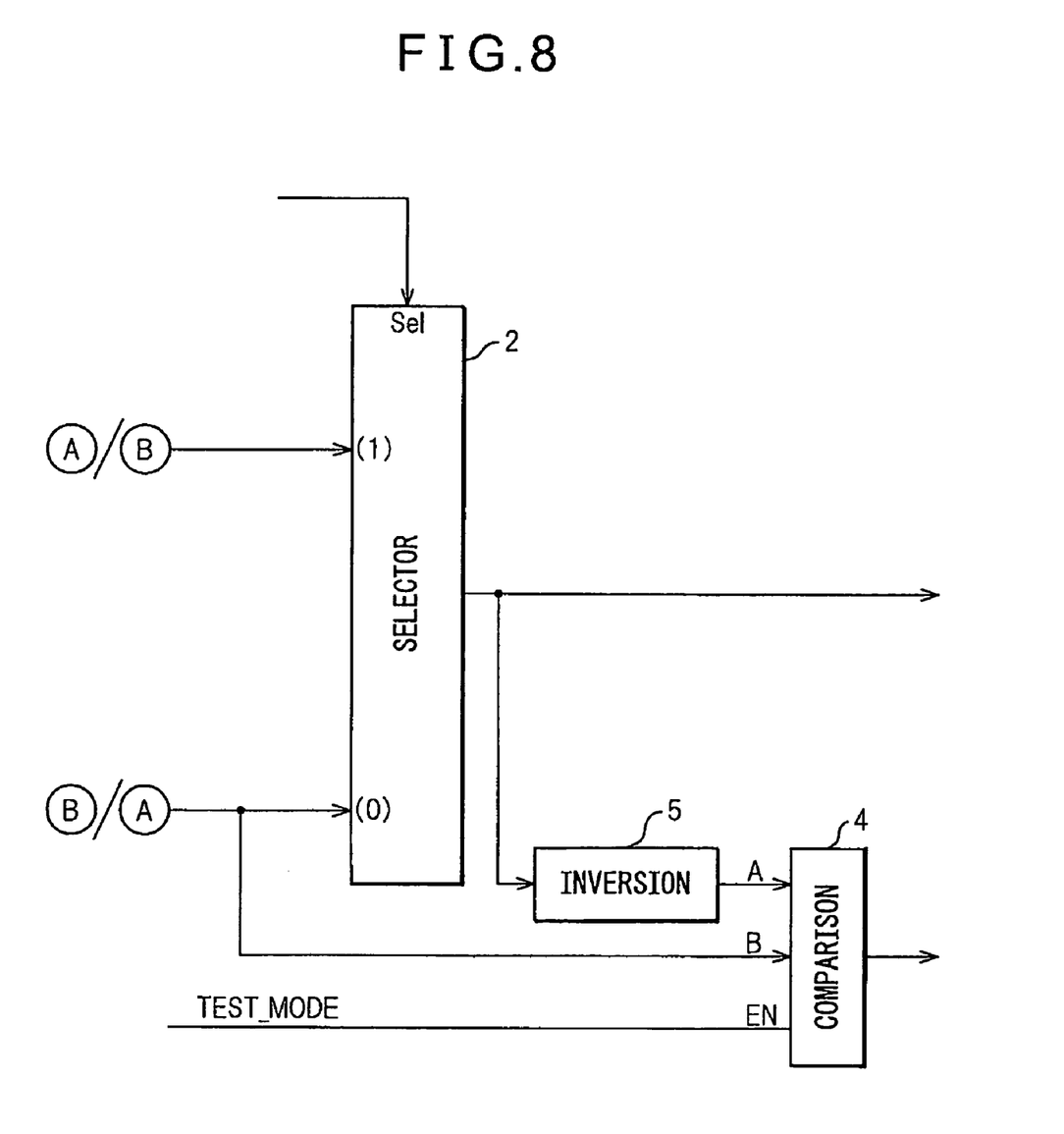
FIG. 8 is a view depicting another modification of the circuit shown in FIG. 3 and FIG. 7.

FIG. 8 depicts a modification of FIG. 3 and FIG. 7. In FIG. 3 and FIG. 7, the output of the down counter 12 or the output of the up counter 13 inputted to the selector terminal (0) of the selector 2 is inputted to the input B of the comparison circuit 4 through the inversion circuit 3. In FIG. 8, the output of the up counter 12 inputted to the terminal (1) of the selector 2 and outputted from the selector 2 is inputted to the comparison circuit 4 through the inversion circuit 5. When the up counter 12 is connected to the terminal (1) of the selector 2, the inversion circuit 5 receives the output of the up counter 12. Similarly, when the down counter 13 is connected to the terminal (1) of the selector 2, the inversion circuit 5 receives the output of the down counter 13.

On the other hand, the output of the other counter inputted to the selector terminal (0) of the selector 2 is inputted as it is to the terminal B of the comparison circuit 4. Therefore, in the circuit of FIG. 8 as well, at the time of the LSI test mode, it is possible to compare the inverted signal of the output of one counter and the output of the other counter.

All examples and conditional language recited herein after intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A test apparatus comprising:
   an up counter,
   a down counter that operates in parallel with the up counter,
   a selector that selects either an output of the up counter or an output of the down counter,
   an inversion circuit that inverts either the counter output selected by the selector or the counter output that is not selected by the selector, and
   a comparison circuit that compares the inverted counter output and the uninverted counter output.

2. The test apparatus as set forth in claim 1, wherein the up counter increments an address of a memory connected the test apparatus, and the down counter decrements an address of the memory.

3. The test apparatus as set forth in claim 1, wherein
   the inversion circuit inverts the counter output that is not selected by the selector, and
   the comparison circuit compares the counter output inverted by the inversion circuit with the counter output selected by the selector.

4. The test apparatus as set forth in claim 1, wherein
   the inversion circuit inverts the counter output selected by the selector, and
   the comparison circuit compares the counter output inverted by the inversion circuit with the counter output that is not selected by the selector.

5. A test method of a circuit, the test method comprising:
   operating in parallel an up counter and a down counter included in the circuit,
   selecting either an up counter output from the up counter or a down counter output from the down counter,
   inverting either the selected counter output or the not-selected counter output, and
   comparing the inverted counter output and the uninverted counter output.

6. The test method as set forth in claim 5, wherein
   the not-selected counter output is inverted, and
   the inverted counter output is compared with the selected counter output.

7. The test method as set forth in claim 5, wherein
   the selected counter output is inverted, and
   the inverted counter output is compared with the not-selected counter output.

8. An integrated circuit comprising:
   an up counter,
   a down counter,
   a counter controller that makes the up counter and the down counter operate in parallel,
   an inverter that inverts one of the up counter output or the down counter output, and
   a comparator that compares the inverted counter output with the uninverted counter output.

* * * * *